United States Patent [19]

Neppl et al.

[11] Patent Number: 4,740,479

[45] Date of Patent: * Apr. 26, 1988

[54] METHOD FOR THE MANUFACTURE OF CROSS-COUPLINGS BETWEEN N-CHANNEL AND P-CHANNEL CMOS FIELD EFFECT TRANSISTORS OF STATIC WRITE-READ MEMORIES

[75] Inventors: Franz Neppl, Munich; Konrad Hieber, Bernau; Ulrich Schwabe, deceased, Munich, all of Fed. Rep. of Germany, by Dagmar Schwabe, legal representative

[73] Assignee: Siemens Aktiengesellschaft, Berlin and Munich, Fed. Rep. of Germany

[ * ] Notice: The portion of the term of this patent subsequent to Feb. 3, 2004 has been disclaimed.

[21] Appl. No.: 874,698

[22] Filed: Jun. 16, 1986

[30] Foreign Application Priority Data

Jul. 5, 1985 [DE] Fed. Rep. of Germany ....... 3524202

[51] Int. Cl.⁴ .......................................... H01L 2/265
[52] U.S. Cl. ........................................ 437/34; 437/56; 437/193; 437/200; 437/233; 357/42; 357/71
[58] Field of Search ............ 29/590, 591, 578, 576 B, 29/571; 357/42, 71; 156/653, 657; 437/34, 56, 193, 200, 233

[56] References Cited

U.S. PATENT DOCUMENTS

| | | | |
|---|---|---|---|
| 4,246,593 | 1/1981 | Bartlett | 357/41 |
| 4,282,648 | 8/1981 | Yu et al. | 357/42 |
| 4,443,930 | 4/1984 | Hwang et al. | 29/571 |
| 4,581,815 | 4/1986 | Cheung et al. | 29/577 C |
| 4,640,844 | 2/1987 | Neppl et al. | 29/571 |

OTHER PUBLICATIONS

IEDM 84–"A New Full CMOS SRAM Cell Structure", by O. Kudoh et al., NEC Corporation, Sagamihara, Kanagawa 229, Japan, pp. 67 to 70.

"Semiconductor Memory Design and Application", by Gerald Luecke et al., McGraw-Hill Kogakusha, Ltd., pp. 115-123.

*Primary Examiner*—Brian E. Hearn
*Assistant Examiner*—Kevin McAndrews
*Attorney, Agent, or Firm*—Hill, Van Santen, Steadman & Simpson

[57] ABSTRACT

Cross-couplings between n-channel and p-channel CMOS field effect transistors of static write-read memories (SRAMs) with buried contacts to the n+ and p+ regions in the substrate are obtained in accordance with known method steps and with a high packing density. A gate level thereof formed of a polycide double layer is used as an additional wiring level for the cross-coupling. The formation of the gate level occurs after the opening of regions for the buried contacts. A doping occurs simultaneously with the generation of source-/drain regions of the n-channel and p-channel transistors by masked ion implantation and a subsequent high-temperature treatment. Accordingly, simple, mask-non-intensive method steps result which are especially useful in the manufacture of 6-transistor SRAMs.

9 Claims, 2 Drawing Sheets

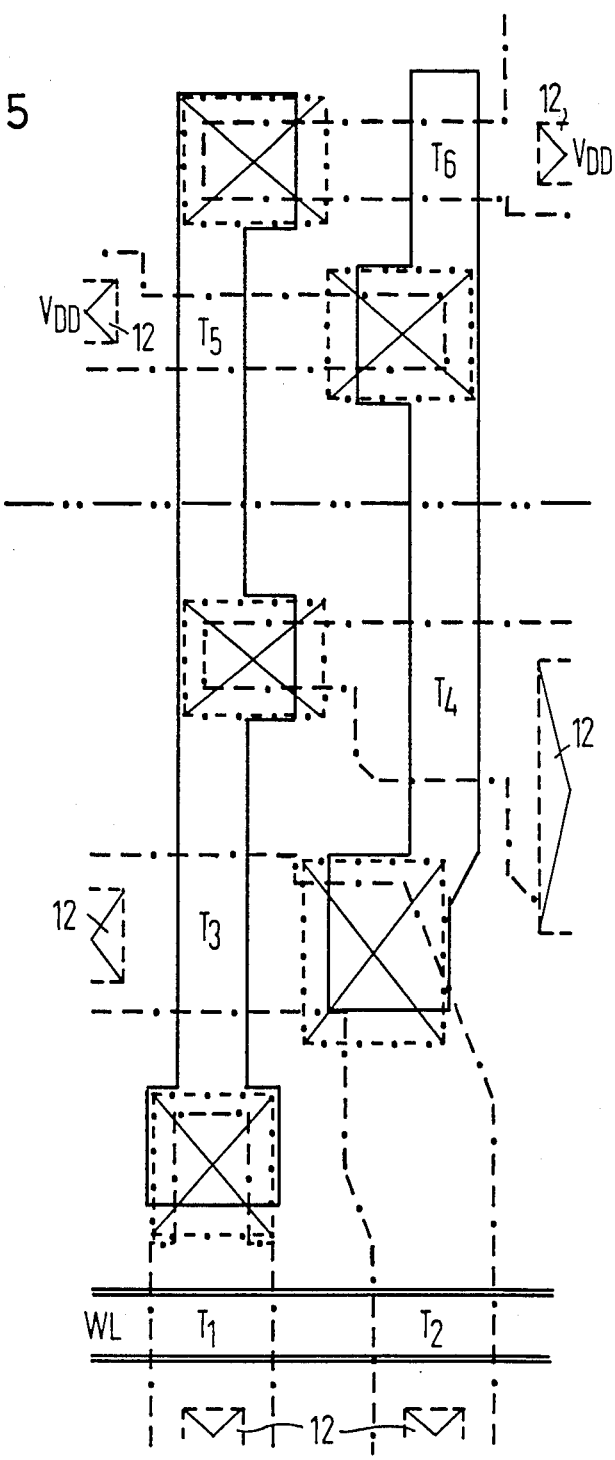

METHOD FOR THE MANUFACTURE OF CROSS-COUPLINGS BETWEEN N-CHANNEL AND P-CHANNEL CMOS FIELD EFFECT TRANSISTORS OF STATIC WRITE-READ MEMORIES

BACKGROUND OF THE INVENTION

The invention relates to a method for the manufacture of cross-couplings between n-channel and p-channel CMOS field effect transistors of static write-read memories (SRAMs) wherein, in accordance with known method steps of CMOS technology (manufacture of complementary CMOS transistors), buried contacts to the diffused n+ and p+ regions of the transistors in the substrate are produced. The gate level is formed of doped polysilicon, and metal silicide is employed as an additional wiring level for the cross-coupling between n-channel and p-channel transistors. The invention also relates to the use of this method for the manufacture of a static 6-transistor memory cell arrangement.

The functioning of a static 6-transistor memory cell as well as its structure can be derived, for example, from the book by Lucke, Mize, Carr, "Semiconductor Memory Design and Application", McGraw Hill, Kogakusha Ltd., FIG. 5.3, page 118, incorporated herein by reference. A disadvantage of this cell in comparison to the dynamic 1-transistor cell is the great space requirement, also due to the required cross-couplings.

The cross-couplings between n-channel and p-channel transistors is a problem, particularly in the CMOS-SRAM cells. In known CMOS technologies with a gate of n+ doped polysilicon or of n+ doped double layers of polysilicon and metal silicide, buried contacts to n+ doped and p+ doped regions at the same time are not possible. The cross-connections must be produced via additional metal bridges. Additional metal grids for each cell are therefore required, these having a distinctly negative effect on the packing density.

A miniaturization of the static RAM cells is enabled by the use of additional wiring levels which, for example, are formed of polysilicon or aluminum. Two method steps of photolithography and of etching respectively arise for each wiring level. The realization of buried contacts to n+ and p+ regions allows the gate level to be used for the required cross-couplings. An auxiliary wiring level can thus be eliminated or, given a constant number of wiring levels, the packing density can be increased.

A method such as that initially cited is recited in a report by Kudoh et al in IEDM Technical Digest 1984, pages 67-70, incorporated herein by reference. It is based on the process of selective silicating, a method which is difficult to manage, and contains mask-intensive steps for local n+ or p+ doping of the polysilicon regions before the silicating.

SUMMARY OF THE INVENTION

An object of the invention is to specify a simple and mask-non-intensive method with which it is possible to manufacture static write-read memory arrangements with a reduced space requirement, based on CMOS technology. The gate level should thereby be used for the required cross-couplings. In particular, however, the manufacture of a 6-transistor SRAM cell with a high packing density in a memory module should be enabled by this method.

An object of the invention is achieved by a method of the type initially cited wherein, after the opening of the regions for the buried contacts, the gate level is formed by deposition of a double layer formed of undoped polysilicon and metal silicide, and structuring of the gate electrodes and of the cross-couplings. The doping of the polysilicon regions and of the n+ and p+ regions in the substrate is carried out simultaneously with the generation of the source/drain regions of the respective transistor type by masked ion implantation and subsequent high temperature treatment.

As a result of the method according to the teaching of the invention, individual process steps of CMOS technology (based on the method proposed in German Patent Application No. P 34 19 034.1, corresponding to U.S. Ser. No. 709,712, filed Mar. 8, 1985, incorporated herein by reference), static RAM cells of high packing density with buried contacts to n+ and p+ regions are obtained with only one additional phototechnique in the manufacture of the contact hole etching for the buried contacts.

A method for the realization of a 6-transistor CMOS-SRAM cell according to the invention shall be set forth in yet greater detail below with reference to FIGS. 1 through 5.

BRIEF DESCRIPTION OF THE DRAWINGS

FIG. 5 shows the complete layout of a cell manufactured by the method steps of the invention.

DESCRIPTION OF THE PREFERRED EMBODIMENTS

Figure 1:
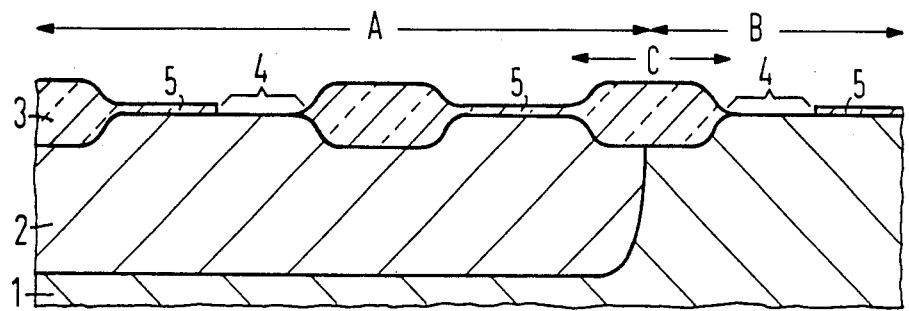
FIGS. 1 through 4 illustrate the method steps of the invention, whereby only two transistor regions and one cross-coupling (region C) are visible.

FIG. 1: In accordance with known method steps of CMOS technology, p-doped tubs 2 are generated in an n-doped silicon substrate 1, and structured SiO$_2$ layers 3 are produced for separating the active transistor regions. They are produced in accordance with what is referred to as the LOCOS (local oxidation of silicon) method. The region A thus relates to the n-channel CMOS field effect transistors, and the region B relates to the p-channel CMOS field effect transistors. The cross-coupling lies in the region C. The surface regions indicated with reference numeral 4 show the contact holes for the buried contacts which are opened in the gate oxide layer 5 by means of photolithography.

Figure 2:
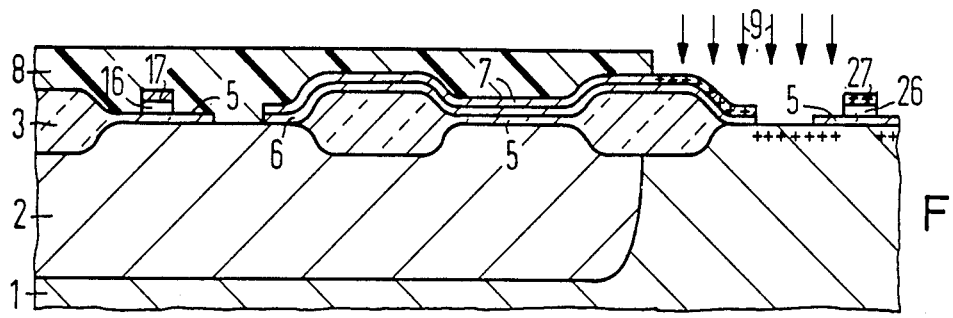

FIG. 2: The surface-wide deposition of a double layer now occurs, this double layer being formed of undoped polysilicon 6 and—after adequate cleaning—of tantalum disilicide 7. This double layer 6, 7 is structured for the definition of the gate electrodes 16/17 and 26/27, as well as of the cross-coupling C. Since the polysilicon is undoped, the two layers can be successively deposited in the same system without aeration. The source/drain implantation 9 for the p-channel transistors B which is masked by means of photoresist 8, occurs with boron in a known way (dosage and energy $5 \times 10^{+15}$ cm$^{-2}$ and 25 keV). Boron (+) is simultaneously implanted into the tantalum disilicide 27 of the p-channel transistors, and into the tantalum disilicide 7 of a part of the cross-coupling C.

Figure 3:
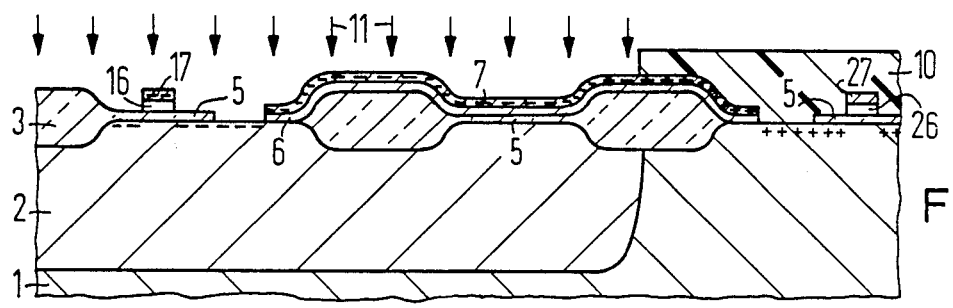

FIG. 3: After removing the photoresist structure 8, a further photoresist structure 10 which covers the regions of the p-channel transistors B in the n-substrate 1 is applied, and an arsenic or phosphorous ion implantation 11 (dosage and energy $5 \times 10^{15}$ cm$^{-2}$ and 80 keV) is carried out for generating the source/drain regions for the n-channel transistors A. Arsenic or phosphorous (−) is simultaneously implanted into the tantalum disilicide 17 of the n-channel transistors, and into the tantalum disilicide 7 of the other part of the cross-coupling C.

Figure 4:
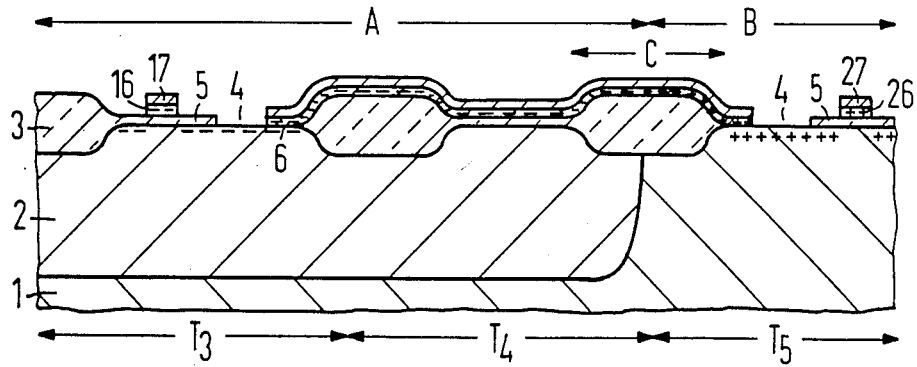

FIG. 4: For generating the source/drain regions of the transistors in the silicon substrate 1 or in the p-tub 2, and for out-diffusion of the respective dopant (+ and −) out of the tantalum disilicide 7, 17, 27 into the polysilicon 6, 16, 26 n+/p+ polycide gate) and in the region of the buried contacts 4, a high-temperature treatment in a nitrogen/hydrogen atmosphere now follows after the removal of the photoresist structure 10. The implanted boron (+) ions and arsenic (−) ions are thus driven into the regions lying therebelow at 900° C. (about 60 minutes). The finishing of the arrangement up to the final metallization occurs in the usual way. The symbols $T_3$, $T_4$, $T_5$ stand for the regions of the three transistors of a 6-transistor cell.

FIG. 5 shows the layout of a 6-transistor SRAM cell manufactured in accordance with the method of the invention. Its space requirement amounts to 37 $\mu$m $\times$ 12.8 $\mu$m = 474 $\mu$m$^2$. The same reference characters as in FIG. 4 apply. $V_{DD}$ indicates the terminals for the supply voltage. The MOS field effect transistor regions are referenced $T_1$ through $T_6$. The solid line bounds the gate metallization (7, 17, 27), the broken line bounds the contact hole regions 12 from the metal level, the dot-dash line bounds the buried contacts 4, and the dash-dash-dot line bounds the edge of the field oxide regions (LOCOS). The dot-dot-dash line separates the p-tub region in the n-doped substrate. The double line marks the word line WL.

As may be derived from FIG. 5, a cross-coupling C proceeds from the gate $T_4$ of the n-channel transistors to the source or drain region $T_5$ of the p-channel transistors, and proceeds from the gate of the transistor $T_5$ to the source-drain region $T_4$ of the n-channel transistors.

A circuit diagram for the operation of this arrangement the specification and incorporated herein by reference.

Although various minor changes and modifications might be proposed by those skilled in the art, it will be understood that we wish to include within the claims of the patent warranted hereon all such changes and modifications as reasonably come within our contribution to the art.

We claim as our invention:

1. In a method for manufacture of cross-couplings between n-channel and p-channel CMOS field effect transistors of static write-read memories SRAMs wherein buried contacts are provided to diffused n+ and p+ regions of the n-channel and p-channel transistors in a substrate, and wherein a gate level formed of doped polysilicon and metal silicide is employed as an additional wiring level for said cross-coupling between the n-channel and p-channel transistors, wherein the improvement comprises the steps of:

after opening regions for said buried contacts, forming the gate level by deposition of a double layer formed of undoped polysilicon and metal silicide and structuring gate electrodes of the n-channel and p-channel field effect transistors and also structuring the cross-couplings;

simultaneously carrying out a doping of cross-coupling regions of said undoped polysilicon and respective gate regions of said undoped polysilicon along with doping of the respective n+ and p+ drain or source regions in the substrate by masked ion implantation; and subsequently providing a high-temperature treatment of the field effect transistors.

2. A method according to claim 1 including the step of manufacturing the double layer formed of undoped polysilicon and tantalum disilicide by vapor-deposition.

3. A method according to claim 1 including the step of manufacturing the double layer formed of undoped polysilicon and tantalum disilicide by sputtering.

4. A method according to claim 1 including the step of manufacturing the double layer formed of undoped polysilicon and tantalum disilicide by chemical vapor deposition CVD.

5. A method according to claim 1 including the step of employing the dopants boron and arsenic for the respective ion implantations.

6. A method according to claim 1 including the step of employing the dopants boron and phosphorous for the respective ion implantations.

7. A method according to claim 1 including the step of carrying out the temperature treatment in a range from 900° to 950° C. and with a time duration of approximately 60 minutes.

8. In a method for the manufacture of transistor memory cell arrangements wherein cross-couplings are provided between n-channel and p-channel CMOS field effect transistors of static write-read memories, and wherein an n-doped substrate is provided for the p-channel transducer and a p-doped tub is provided in the n-doped substrate for the n-channel transistor, and wherein contact holes are provided through an insulating layer to the n-doped substrate and the p-doped tub, the improvement comprising the steps of:

applying onto the insulating layer a double layer formed of undoped polysilicon and a metal silicide;

structuring the double layer to form respective gate electrodes for the p-channel and n-channel transistors and for the cross-coupling;

masking the n-channel transistor and part of the cross-coupling, and through ion doping, simultaneously doping the uncovered portion of the cross-coupling and the p-channel gate electrode together with the source or drain region through said opening;

removing the mask and masking the p-channel transistor and the doped part of the cross-coupling, and then in another ion implantation step, doping the n-channel gate electrode, the source/drain region of the n-channel transistor through said opening, and uncovered portions of the cross-coupling;

removing the mask; and providing a high temperature treatment of the n-channel and p-channel transistors.

9. In a method for the manufacture of transistor memory cell arrangements wherein cross-couplings are provided between n-channel and p-channel CMOS field effect transistors of static write-read memories, and wherein an n-doped substrate is provided for the p-channel transistor and a p-doped tub is provided in the n-doped substrate for the n-channel transistor, and wherein contact holes are provided through an insulating layer to the n-doped substrate and the p-doped tub, the improvement comprising the steps of:

applying onto the insulating layer a double layer formed of undoped polysilicon and a metal silicide;

structuring the double layer to form respective gate electrodes for the p-channel and n-channel transistors and for the cross-coupling;

masking the p-channel transistor and part of the cross-coupling, and through ion doping, simultaneously doping the uncovered portion of the cross-coupling and the n-channel gate electrode together with the source or drain region through said opening;

removing the mask and masking the n-channel transistor and the doped part of the cross-coupling, and then in another ion implantation step, doping the p-channel gate electrode, the source/drain region of the p-channel transistor through said opening, and uncovered portions of the cross-coupling;

removing the mask; and providing a high temperature treatment of the n-channel and p-channel transistors.

* * * * *